(12) United States Patent
Zivny

(10) Patent No.: US 12,298,329 B2
(45) Date of Patent: May 13, 2025

(54) TERMINATION TRIGGER PICK-OFF FOR REMOTE HEAD SAMPLER

(71) Applicant: Tektronix, Inc., Beaverton, OR (US)

(72) Inventor: Pavel R. Zivny, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 107 days.

(21) Appl. No.: 18/148,709

(22) Filed: Dec. 30, 2022

(65) Prior Publication Data

US 2023/0213556 A1  Jul. 6, 2023

Related U.S. Application Data

(60) Provisional application No. 63/297,218, filed on Jan. 6, 2022.

(51) Int. Cl.
*G01R 13/26* (2006.01)
*G01R 13/34* (2006.01)

(52) U.S. Cl.
CPC ........... *G01R 13/26* (2013.01); *G01R 13/347* (2013.01)

(58) Field of Classification Search
CPC .. G01R 1/36; G01R 13/0254; G01R 13/0272; G01R 13/0281; G01R 13/26; G01R 13/347
See application file for complete search history.

(56) References Cited

U.S. PATENT DOCUMENTS

| | | | | |
|---|---|---|---|---|
| 2002/0167373 | A1* | 11/2002 | Agoston | H01P 5/085 |
| | | | | 333/20 |
| 2008/0001798 | A1* | 1/2008 | Moll | G01R 31/31708 |
| | | | | 327/107 |
| 2016/0363614 | A1* | 12/2016 | Mochizuki | H04L 7/0334 |
| 2021/0389373 | A1* | 12/2021 | Pickerd | G01R 31/31708 |

OTHER PUBLICATIONS

Tektronix S-4 Instruction Manual, Revised Oct. 1986 (Year: 1986).*

* cited by examiner

*Primary Examiner* — Neel D Shah
*Assistant Examiner* — Adam S Clarke
(74) *Attorney, Agent, or Firm* — Miller Nash LLP; Andrew J. Harrington

(57) ABSTRACT

A test and measurement device includes an input port to receive an input signal, a sampling circuit structured to generate a sample from the input signal, in which generating the sample from the input signal produces an amount of kickout energy, and an energy reducing circuit coupled between the sampling circuit and one or more other components of the test and measurement device, the energy reducing circuit structured to decrease the amount of kickout energy from the sampling circuit. The energy reducing circuit may include or be combined with a pick-off circuit. Methods are also described.

19 Claims, 6 Drawing Sheets

TERMINATION TRIGGER PICK-OFF FOR REMOTE HEAD SAMPLER

CROSS-REFERENCE TO RELATED APPLICATION

This disclosure claims benefit of U.S. Provisional Application No. 63/297,218, titled "TERMINATION TRIGGER PICK-OFF FOR REMOTE HEAD SAMPLER," filed on Jan. 6, 2022, the disclosure of which is incorporated herein by reference in its entirety.

TECHNICAL FIELD

This disclosure relates to test and measurement instruments, and more particularly to sampling oscilloscopes.

BACKGROUND

Real-Time Oscilloscopes (RTOs) are structured to faithfully create a sampled waveform from an input signal by sampling the input signal at relatively high sample rates. Creating an oscilloscope with these high sampling rates generally involves expensive components, and therefore RTOs are typically more expensive than other types of oscilloscopes and other measuring instruments. If the input signal is a repeating signal, an Equivalent Time-sampling Oscilloscope (ETO) may also be used to create a sampled waveform that is faithful to the input signal. One difference between ETOs and RTOs is that, where RTOs create the sampled waveform by taking many samples of a single waveform, ETOs instead take only a few samples from many different waveforms, and then construct a final sampled waveform by combining the multiple samples. Since the input signal sampled by the ETO scope is a repeating, non-changing, signal, the ETO is able to create sampled waveforms equal to the accuracy of sampled waveforms created by an RTO at a much lower cost, because the sampling components of an ETO need not operate nearly at the speeds of the sampling components of the RTO. One of the few drawbacks of ETOs compared to RTOs is that ETOs take much longer than RTOs to generate the same sampled waveform, due to the ETOs sampling many more waveforms of the input signal than the RTO. But in many cases, creating a faithful representation of an input signal with a less expensive instrument, such as an ETO, is more important than creating the faithful representation quickly, such as by using an RTO. Another drawback is that a precisely timed trigger is necessary; this often mandates a hardware clock recovery circuit.

Traditional ETO architecture includes an input port to receive an input signal from a Device Under Test (DUT), which is then split by a splitter into two separate signals. One of the split signals is fed to a signal sampler, described above, while the other of the split signals is fed to a clock recovery system or other type of trigger system. The clock recovery system allows the ETO, or any oscilloscope, to extract timing information about the input signal from the input signal itself, and without the need to supply a separate clock signal to the oscilloscope. Splitting the input signal prior to sampling the signal creates problems in that, first, the signal fidelity of the input signal is impaired or decreased by the presence of the splitter. Secondly, splitting the input signal, with one portion going to the sampler and another portion going to the clock recovery or trigger system, divides the energy of the input signal, reducing its signal-to-noise ratio (SNR), for both the signal sampler as well as the second circuit. Merely removing the splitter and performing the clock recovery after the signal has been sampled is not a viable solution because the energy introduced into the system by the sampler, the so-called kickout energy, which would normally be blocked or limited from the DUT and from the clock recovery system by the presence of the splitter, would now not be blocked. Kickout energy traveling into the clock recovery system and into the DUT could interfere with the operation of the clock recovery, and potentially interfere with the operation of the DUT itself. In either case it could inhibit the ETO from generating a waveform sample that is faithful to the input signal from the DUT.

Embodiments according to the disclosure address these and other issues with conventional sampling systems.

DESCRIPTION

Figure 1A:
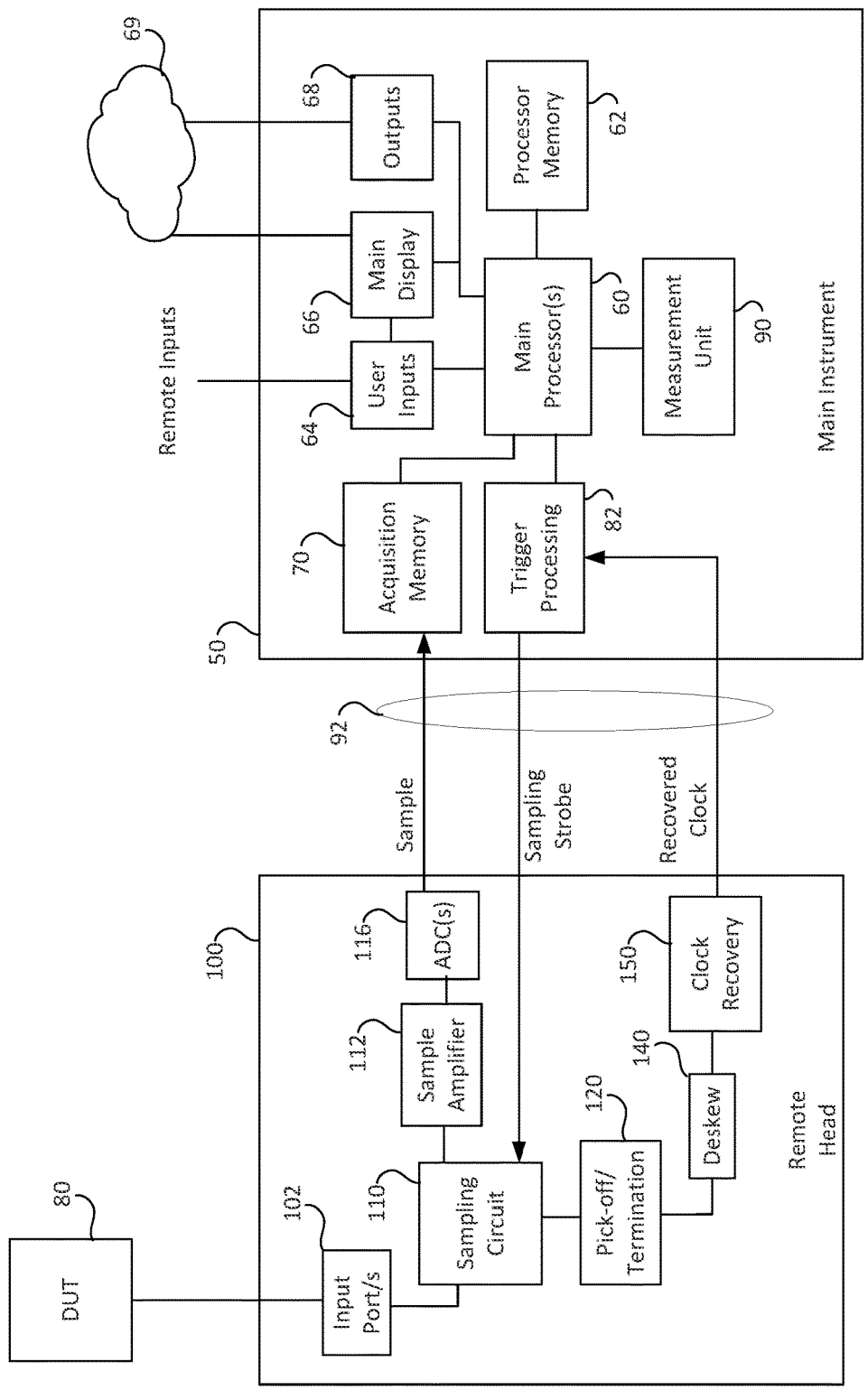
FIG. 1A is a block diagram of a test and measurement system including a remote head including a pick-off and termination circuit, according to disclosed embodiments.

Embodiments of the disclosed technology generally improve the system of an equivalent time sampling oscilloscope (ETO), or other measurement instrument operating with a clock recovery. FIG. 1A is a block diagram of a test and measurement system including a measurement instrument 50 as well as a remote head 100. The remote head 100 includes a pick-off and termination circuit, which minimizes energy introduced by the sampling circuit from being fed back to the DUT, according to disclosed embodiments.

In general, the instrument 50 may be an oscilloscope, such as an equivalent time sampling oscilloscope (ETO), which is also known as a digital sampling oscilloscope, although the main instrument may be any type of measurement instrument that may benefit from embodiments of the invention.

The instrument 50 includes one or more main processors 60, which is coupled processor memory 62, which may include RAM, ROM, and/or and cache memory. The processor memory 62 may store instructions for the one or more processors 60, as well as data used by the instrument 50. The stored data may include digitized values representative of the input signal, timebase calibration values, look-up tables and the like. In some embodiments the digitized values representative of the input signal may be stored in an acquisition memory 70, which receives the sample from the remote head. The acquisition memory is also coupled to the one or more processors 60, so the contents stored therein are available to other components, such as measurement unit 90, which form part of the main instrument 50. The measurement unit 90 may be one or more separate circuits or modules, and can include any component capable of measuring aspects (e.g., voltage, amperage, amplitude, energy, etc.) of a signal received from a Device Under Test (DUT) 80.

User inputs 64 and user outputs 68 are coupled to the processor 60. The user inputs 64 may include a keyboard, mouse, touchscreen, and/or any other controls employable by a user to set up and control the instrument 50. The user inputs 64 may be embodied by a graphical user interface and/or text/character interface operated in conjunction with a main display 66. The user inputs 64 may further include programmatic inputs from the user on the instrument 50, or from a remote device. The main display 66 may be a digital screen, a cathode ray tube-based display, or any other monitor to display waveforms, measurements, and other data to a user. The user outputs 68 may include test data and other results that may or may not be displayed on the main display 66. For example, the user may control the instrument 50 to produce a set of data from the outputs 68 for later analysis, or for analysis by another device. To facilitate export of user outputs, the outputs 68 may be sent to a network 69, such as the internet, or a local network, to be accessed by another device.

While the components of the test instrument 50 are depicted as being integrated within test and measurement instrument, it will be appreciated by a person of ordinary skill in the art that any of these components can be external to test instrument 50, such as in a remote head 100, or in another device, and can be coupled to test instrument 50 in any conventional manner (e.g., wired and/or wireless communication media and/or mechanisms). For example, in some embodiments, the main display 66 may be remote from the test and measurement instrument 50, or the instrument may be configured to copy display output to the network 69, in addition to displaying it on the instrument 50, so that the display may be viewed remotely.

In the illustrated environment, the main instrument is coupled to a remote head 100, which receives one or more signals from the DUT 80 for processing by the main instrument. Generally, the remote head 100 is positioned close to the DUT 80, or even physically attached to the DUT, to maximize the integrity of signals being measured from the DUT. Also, in general, the remote head is coupled to the main instrument 50 through one or more communication wires, which are typically one or more coaxial wires 92.

The remote head 100 includes one or more ports 102, which may be any electrical signaling medium. In the embodiment described with reference to FIG. 7, the input ports receive an optical signal from the DUT 80. The ports 102 may include receivers, transmitters, and/or transceivers. Each port 102 is a channel of the test and measurement instrument 50. The ports 102 is initially coupled to a sampling circuit 110, which is controlled by a strobe signal, described below. When the strobe signal is received by the sampling circuit 110, the sampling circuit takes a measurement of the input signal from the DUT 80. Taking such a sample creates a small amount of energy, referred to as kickout energy, which was described above. The kickout energy is generated to initiate the sampling circuit 110 to take its measurement of the input signal from the DUT 80. Embodiments according to the disclosure include particular hardware and take particular steps to minimize the amount of kickout energy that is sent back to the DUT 80, as described in detail below.

After the sampling circuit 110 takes a sample, it may be amplified by an amplifier 112 as well as converted to a digital signal through one or more Analog to Digital Converters (ADCs) 116. Other signal or sampling conditioning circuits may also be present. Then the sample is sent to the main instrument where it is received. As described above, in an ETO oscilloscope, many samples, which may number in the thousands, millions, or billions of samples from the input signal are assembled by the main instrument 50 and stored in the acquisition memory 70 for later use by the instrument.

Note that, unlike instruments described above, no signal splitter exists between the input ports 102 and the sampling circuit 110. Recall that conventional instruments split the input signal using a splitter, with a first portion being provided to a sampling circuit, and another portion being provided to a clock recovery or trigger circuit. This process diminishes the signal integrity received from the DUT 80. Instead, embodiments according to the disclosure do not include a splitter circuit, and instead pass the signal received from the input ports 102 to the sampling circuit 110 to make its measurement on the unencumbered input signal.

Instead of splitting the input signal, as in previous instruments, after the sampling circuit 110 has prepared the present sample from the input signal, the signal is passed to a pick-off/termination circuit 120, which is described in detail below. In some embodiments, the pick-off/termination circuit 120 performs at least two functions. One function is that it includes a signal termination, so that the input signal from the DUT 80 terminates in the typical fashion, i.e., the signal is not reflected back to the DUT, which could interfere with DUT operation, or could decrease signal integrity of the input signal. This function of the pick-off/termination circuit 120 is referred to as strobe block, because it minimizes, or blocks, the kickout energy put into the sample circuit 110 caused by operating the sampling strobe. Another function of the pick-off/termination circuit 120 is that it provides a mechanism to retrieve a portion of the input signal for later processing, such as for clock recovery or trigger processing. After this portion of the input signal is 'picked-off' by the pick-off/termination circuit 120, it is sent to a clock recovery system 150, which generates a clock signal directly from the input signal, without the necessity of a separate clock signal being provided by the DUT 80. In some embodiments a clock deskew process 140 operates on the signal prior to it being sent to the clock recovery system, or on the recovered clock, in which case it would be placed after the clock recovery system 150 rather than before. In other embodiments such a deskew system is integrated into the clock recovery system 150 itself. Also, in some embodiments, the clock recovery system 150, and potentially the clock deskew 140 are located in the main instrument 50, and not in the remote head 100 as illustrated in FIG. 1A. This second embodiment, with the clock recovery system 150 and the clock deskew 140 located in the main instrument 50 is illustrated in FIG. 1B.

The recovered clock from the clock recovery system 150 is provided to (as in FIG. 1A) or generated within (as in FIG. 1B) the main instrument 50. In either case, output from the pick-off termination 120 is provided to the main instrument 50, either before or after the clock recovery function. The signal is provided through an interconnect, which is generally one or more co-axial wires 92, although other types of interconnects may also be used. In FIG. 1A, the main instrument 50 feeds the recovered clock signal into a trigger processing system 82. In FIG. 1B, the main instrument generates the clock recovery signal in the clock recovery system 150. In either case, the clock recovery signal is fed to the trigger processing system 82. The trigger processing system uses the recovered clock to generate the sampling strobe, which is sent back to the remote head 100. The sampling strobe is a signal that causes the sampling circuit 120 to create its next sample. As described above, the trigger processing system 82 may generate a varying amount of delay prior to generating the sampling strobe, so as to locate, within the repeating input signal, another portion of the input signal to be used for generating the next sample. Either the clock recovery system 150 or trigger processing system 82 may include holdoff circuitry to further limit when the sampling strobe is generated. The trigger processing system 80 may be further controlled by the instrument 50 to modify trigger conditions, decimator functions, and other acquisition related parameters. For example, the trigger processing system 82 may accept input from the one or more processors 60 of the instrument 50 to control trigger parameters, such as trigger threshold level, hold off, post trigger acquisition, and the like in response to user input.

The test and measurement instrument 50 and/or remote head 100 may include additional hardware and/or processors, such as conditioning circuits, and/or other circuitry to faithfully convert the received signal from the DUT 80 to a waveform for further analysis. For example, the instrument 50 may include one or more patterning modules to recognize patterns, and irregularities of patterns, of signals received from the input signal. Further, the instrument 50 may further include one or more timebase processors to manage timing information gleaned from the input signal, or to operate the instrument.

Figure 1B:
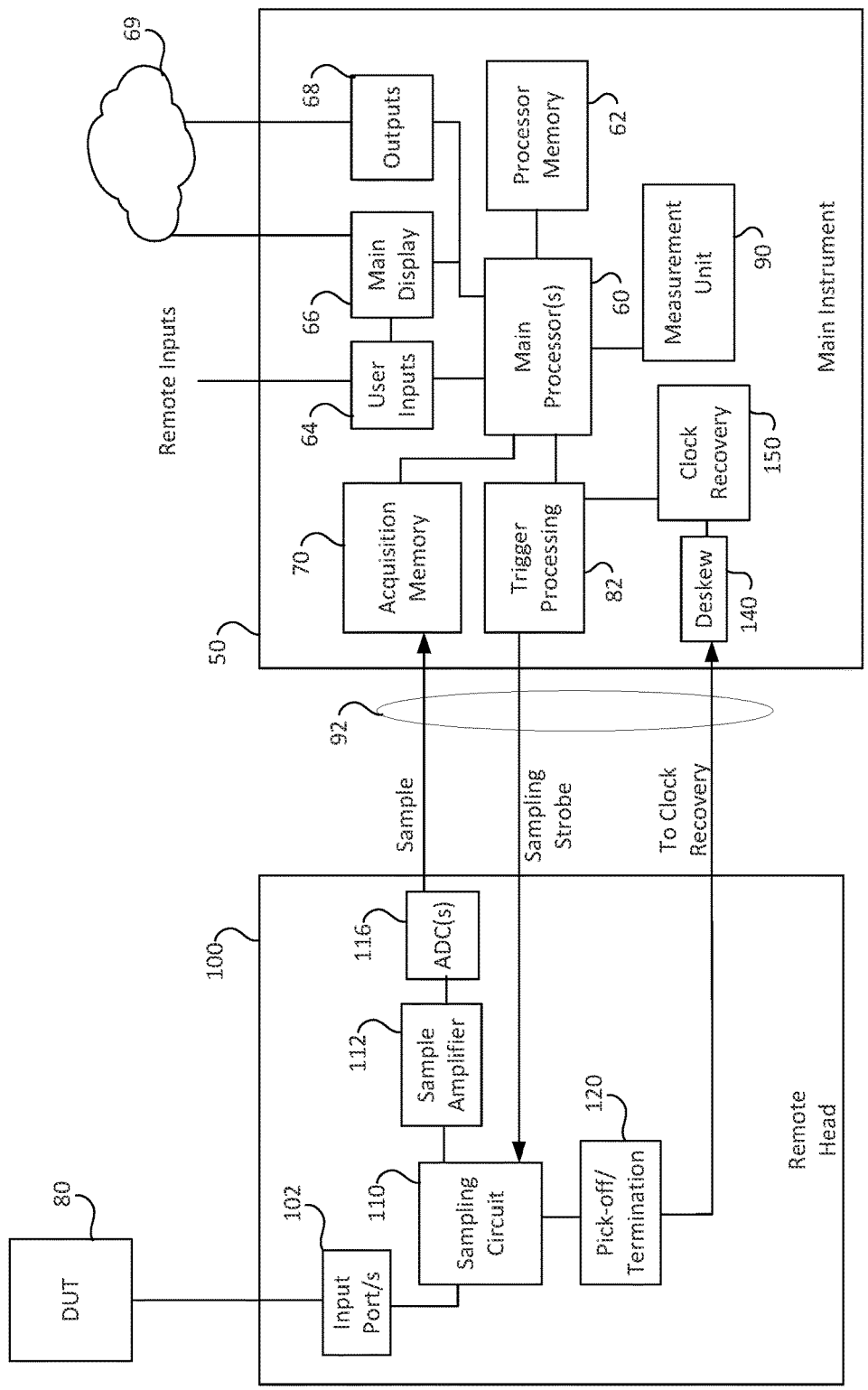
FIG. 1B is a block diagram of a test and measurement system including a remote head including a pick-off and termination circuit, in which a clock recovery circuit is located in a main instrument, according to disclosed embodiments.
Figure 2:
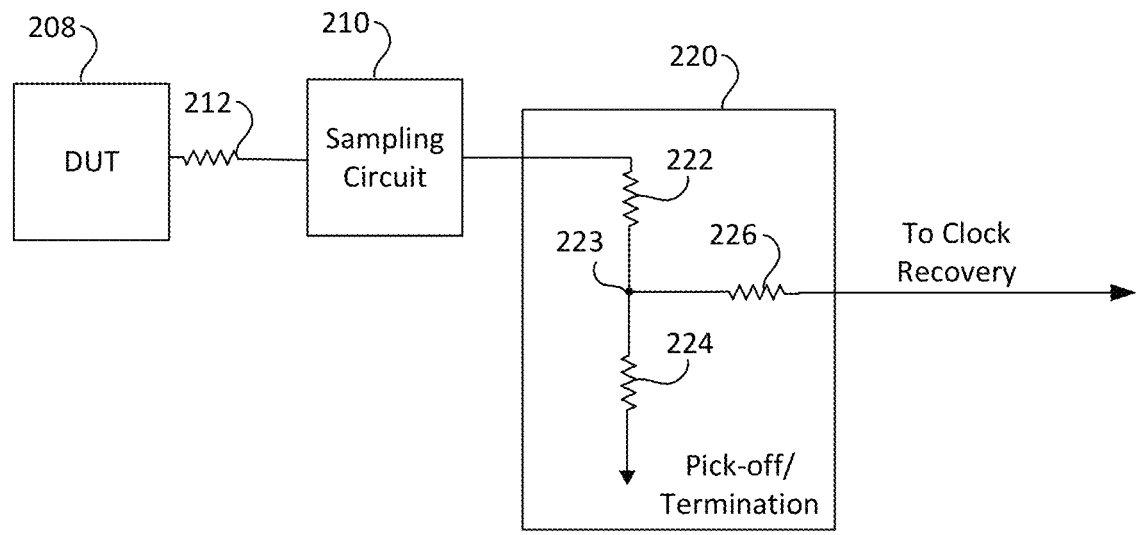
FIG. 2 is a block diagram illustrating an example embodiment of a pick-off/termination component of the remote head of FIG. 1A or 1B, according to embodiments of the disclosure.

FIG. 2 is a block diagram illustrating an example embodiment of a pick-off/termination component 220 of the remote head of FIG. 1A or 1B, among other components, according to embodiments of the disclosure. The pick-off/termination component 220 may be an example of the pick-off/termination component 120 of FIG. 1A or 1B. In the illustrated environment, the pick-off/termination component 220 includes a resistor network formed of three resistors 222, 224, and 226. The resistor 222 provides resistance between the sampling circuit and a node 223 located between the resistors 222 and 224. The resistor 226 provides a resistance between the node 223 and downstream circuits that use the input signal, such as the clock recovery system 150 of FIG. 1A or 1B. Further, the pick-off/termination component 220 may operate in conjunction with another resistor 212, which may be placed between a DUT 208 and the sampling circuit 210. In general, the pick-off/termination component 220 provides the two functions described by the pick-off/termination component 120 described with reference to FIGS. 1A and 1B. For example, the input signal from a sampling circuit 210, which may be an example of the sampling circuit 110 of FIG. 1A or 1B, terminates by passing through the resistors 222, 224 to a ground reference. A portion of the input signal, however, is 'picked-off' before being terminated. This portion passes through the resistor 226 before being provided to downstream processing, such as clock recovery. The resistance values of each of the resistors, 212, 222, 224, 226 may be selected to minimize any kickout energy, i.e., energy caused by operating the sampling circuit 210 from being reflected back to the DUT 208. So, the presence of the resistor network in the pick-off/termination component 220, as well as the resistor 212, if present, between the sampling circuit 210 and the DUT 208, minimizes kickout energy while also providing an ability for the input signal to be used throughout the measurement and testing system. Another component of the system also reduces kickout energy, which is the fact that the output signal of the pick-off/termination component 120 of FIG. 1B is coupled to the instrument 50 through a coaxial cable 92. The presence of the coaxial cable 92 operates to further diminish any kickout energy, as some of the energy caused by operating the sampling circuit 210 is passed through the resistor 226, and further through the coaxial cable 92, which acts to further dissipate any kickout energy generated by the sampling circuit. Also, circuitry or other steps may be used, described with reference to FIGS. 3-6 below, to minimize the effect of such kickout energy prior to it being passed to the clock recovery. It should be noted that, while FIGS. 2-6 illustrate that the portion of the input signal passing through resistor 226 is passed to a clock recovery system, in some embodiments the portion of the input signal passing through resistor 226 may be provided to any downstream component in the test and measurement system, and not necessarily a clock recovery system. In general, the resistors 212, 222, 224, 226 may each be selected to have a resistance between 0-200 Ohms, in any combination, depending on the design and details of the implementation.

Although the pick-off/termination component 220 of FIG. 2 uses a resistor divider network, it is not strictly necessary to use a resistive divider, or a divider at all. Instead, in some embodiments, the resistor 224 may be omitted entirely, i.e., by setting its resistance at 0 Ohms, and having the full signal pass to the clock recovery or other system.

Figure 3:
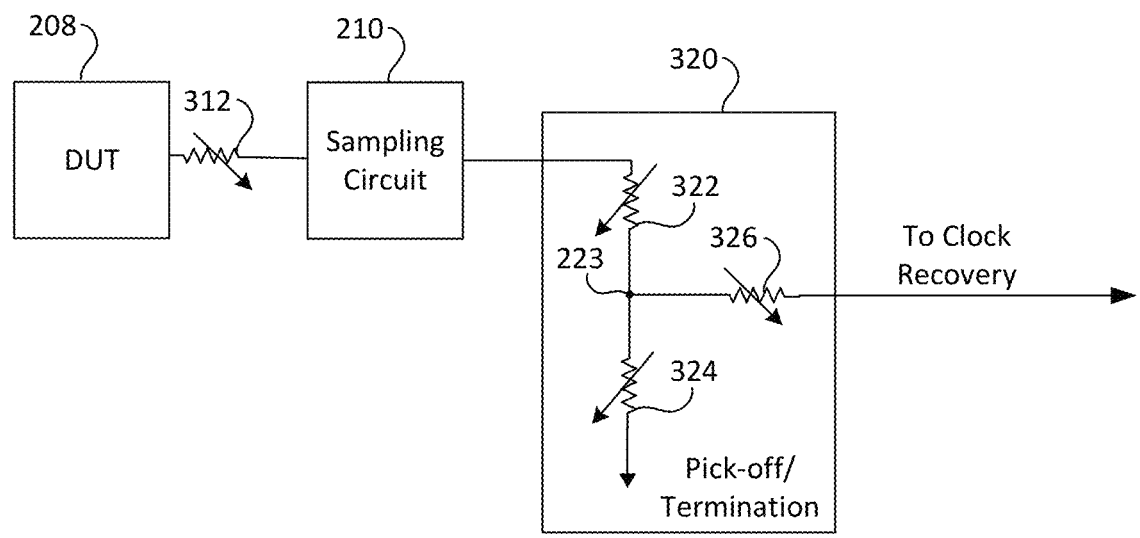
FIG. 3 is a block diagram illustrating another example embodiment of a pick-off/termination component of the remote head of FIG. 1A or 1B, according to embodiments of the disclosure.

Also, instead of using static resistors, such as described with reference to FIG. 2, embodiments of the invention may vary the amount of resistance by including variable resistors in the pick-off/termination component 120 or for a resistor 312 that is coupled between the DUT 208 and sampling circuit 210. FIG. 3 is a block diagram illustrating another example embodiment of a pick-off/termination component 320, which may be an embodiment of the pick-off/termination component 120 of FIG. 1A or 1B, according to embodiments of the disclosure. In addition, the DUT 208 and sampling circuit 210 are also illustrated in FIG. 3. In the illustrated embodiment, all of the resistors 212, 222, 224, 226 of FIG. 2 are replaced by variable resistors 312, 322, 324, and 326, respectively. In some embodiments only 1, 2, or 3 of the resistors 212, 222, 224, 226 are replaced by variable resistors. By using variable resistors 322, 324, 326, the pick-off/termination component 320 may be adjusted to simultaneously minimize the amount of kickout energy reflected back to the DUT 208 through the sampling circuit 210, while also maximizing the quality of the signal passed to the clock recovery system, or other system, in the instrument 50. Further, using variable resistor 312 directly controls the energy generated by the sampling circuit 210 from having a large impact on the DUT 208. Controlling the variable resistors 322, 324 in the pick-off/termination component 320 allows the pick-off/termination component 320 to control the voltage sensed at the node 223, while controlling the variable resistor 326 allows control over the portion of the input signal passed to the clock recovery system. Actual setting of the variable resistors 312, 322, 324, and 326 may be performed in the factory, during production of the instrument 50 or remote head 100 of FIGS. 1A and 1B. In other embodiments the instrument 50 or remote head 100 of FIG. 1A or 1B may include a facility for adjusting the variable amount of resistance of any or all of the variable resistors 312, 322, 324, and 326 through the user inputs 64.

Figure 4:
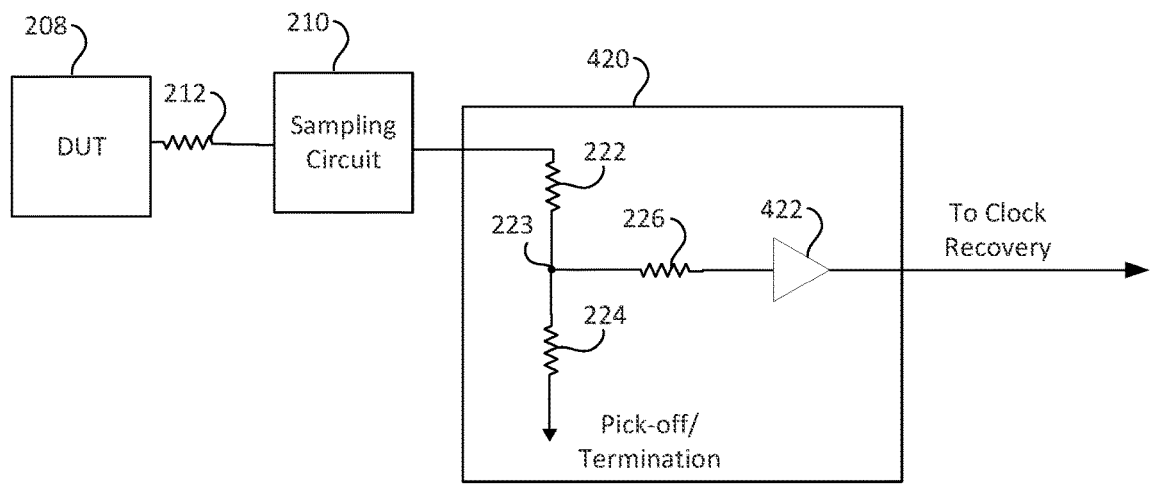
FIG. 4 is a block diagram illustrating yet another example embodiment of a pick-off/termination component of the remote head of FIG. 1A or 1B, according to embodiments of the disclosure.
Figure 5:
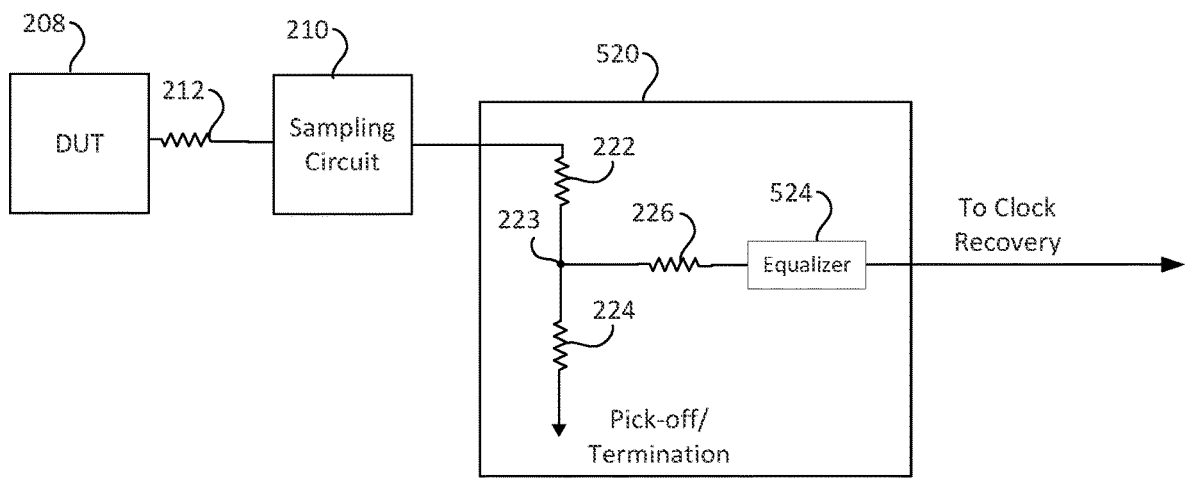
FIG. 5 is a block diagram illustrating an additional example embodiment of a pick-off/termination component of the remote head of FIG. 1A or 1B, according to embodiments of the disclosure.
Figure 6:
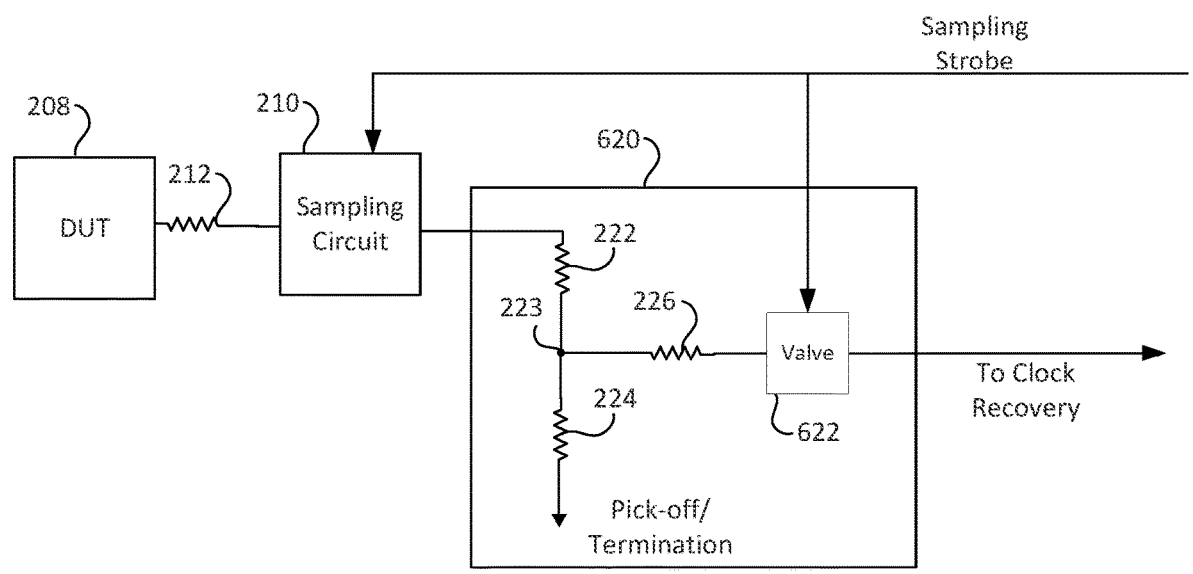
FIG. 6 is a block diagram illustrating a further example embodiment of a pick-off/termination component of the remote head of FIG. 1A or 1B, according to embodiments of the disclosure.

FIGS. 4-6 illustrate additional components in the pick-off/termination circuit that may be used to minimize the amount of kickout energy caused by the operation of the sampling circuit. Although in these illustrated embodiments the resistors 212, 222, 224, 226 are illustrated as being static resistors, any or all of the resistors may be replaced with variable resistors, as described above with reference to FIG. 3.

FIG. 4 illustrates a pick-off/termination circuit 420 which may be an example of the pick-off/termination circuit 120 of FIG. 1A or 1B. The pick-off/termination circuit 420 includes an amplifier 422, located between the node 223 and the output signal for the clock recovery system. The amplifier 422 may be located on either side of the resistor 226, depending on implementation details. The purpose of the amplifier 422 is to minimize the effect of the kickout energy caused by the sampling circuit 210 prior to a portion of the input signal being routed to the clock recovery system, or other component in the measurement system. In some embodiments, the amplifier 422 operates with a negative gain, i.e., to reduce the level of kickout energy received at an input of the amplifier 422 during sampling. The amplifier may divert the kickout energy to ground or through its components. Further, in some embodiments the amount of gain, negative or positive, of the amplifier 422 may be controllable by the user through the user inputs 64 described above.

FIG. 5 illustrates a pick-off/termination circuit 520 which may be an example of the pick-off/termination circuit 120 of FIG. 1A or 1B. The pick-off/termination circuit 520 includes an equalizer 524, located between the node 223 and the output signal for the clock recovery system. As above, the equalizer 524 may be located on either side of the resistor 226, depending on implementation details. Similar to the amplifier embodiment described above, the purpose of the equalizer 524 is to minimize the effect of the kickout energy caused by the sampling circuit 210 prior to a portion of the input signal being routed to the clock recovery system, or other component in the measurement system. The equalizer 524 may include one or more filters particularly structured to block or reduce the kickout energy from reaching the clock recovery system. In some embodiments, the equalizer 524 limits or reduces low frequency signals, while increasing, or not-diminishing high frequency signals. In embodiments where the clock recovery system is located in the main instrument 50 illustrated in FIG. 1B, the equalizer 524 may be used to de-embed the effects caused by the interconnect between the remote head 100, where the pick-off/termination circuit 520 is located, and the main instrument 50. For example, the equalizer 524 may de-embed the effects of the coaxial cable 92, described above with reference to FIGS. 1A and 1B. Measuring the effects of the coaxial cable 92, such as dispersion, Inter-Symbol Interference (ISI), and bandwidth limiting, and de-embedding those effects is a function that may be performed by a user operating the instrument 50. The equalizer 524 may be combined with, or include one or more amplifiers 422, described above with reference to FIG. 4, to more fully characterize the equalizer.

FIG. 6 illustrates a pick-off/termination circuit 620 which may be another example of the pick-off/termination circuit 120 of FIG. 1A or 1B. Differently than the embodiments described with reference to FIGS. 4 and 5, the pick-off/termination circuit 620 includes a valve that is controlled by the sampling strobe signal, or a signal derived from the sampling strobe. The valve 622 operates to block any signal from passing through it during the strobe signal, or within a short time of receiving the strobe signal. Such a short delay may provide time for the kickout energy to propagate from the sampling circuit 210 to the valve 622. Thus, the valve 622 blocks any energy, and specifically the kickout energy, that is provided to the valve 622 while it is in operation. It may dissipate the energy by shunting it to ground or routing it elsewhere. Like the above embodiments, the valve 622 may be located on either side of the resistor 226, depending on implementation details. As well, the valve 622 might be part of a phase detection function of the clock recovery, and operate to prevent the kickout energy from disturbing the clock recovery's phase lock.

All of the embodiments described above with reference to FIGS. 2-6 may be combined in any combination to minimize the amount of kickout energy being passed from the sampling circuit 210 to the clock recovery circuits or elsewhere in the measurement system. For example, an energy dispersing system between the sampling circuit 210 and other components may include one or more of a resistor network, an amplifier, an equalizer, and a valve controlled by the sampling strobe, in any combination.

Thus, embodiments of the invention prevent or reduce the amount of kickout energy generated by the sampling circuit from propagating either downstream to components of the instrument, or remote head, and even back towards the DUT. Embodiments accomplish this goal by including a pick-off system in the remote head, after the sampler, combined with reducing reflection from the pick-off and from the delivery of that signal to a clock recovery system, or elsewhere in the measurement system. By simultaneously incorporating these features, the measurement system according to embodiments of the invention delivers a system that can faithfully reproduce a waveform sample from an input signal without negatively affecting operation of the DUT.

In more detail, embodiments of the disclosure limit impairments by including one or more features. Locating the pick-off in the signal stream after the remote head sampler prevents loss of signal fidelity that would result from a splitter being applied prior to the sampler. Further, locating the pick-off after the remote head sampler prevents loss of signal to the sampler by not dividing the signal power prior to the sampler, as in previous system, which necessarily reduces the signal to noise ratio of the sampler. In some embodiment, isolating the remote head from the instrument through a connection, for example a coaxial cable, prevents a loss of signal integrity from significant length of cable between the DUT and the sampler, since the whole remote head can be moved to a close proximity of the DUT. Thus, this positioning avoids a lengthy interconnect between the DUT and the remote head and avoids signal integrity problems caused by such a length interconnect. Including a pick-off/termination, such as that described in some embodiments above, limits loss of signal integrity by the reflection by mismatching the pick-off and the follow-up path by inserting a non-reciprocal component, such as an amplifier, equalizer, or valve, or combination, in the path between the pick-off and the clock recovery. Some embodiments include a resistor divider in the pick-off/termination, which additionally divides the signal from the sampler, so as to further limit reflections. Further, presence of an equalizer can remove the signal fidelity loss due to or caused by the interconnect between the remote head and the clock recovery system by equalizing the path between the remote head and the clock recovery. Further, embodiments may limit the effect of the kick-off of the strobe into the clock recovery path by decreasing the gain of the path from pick-off/ termination at the time of the kick-off. Yet further, a valve placed between the sampling circuit and the clock recovery, or into the phase detection function of the clock recovery, can be controlled to block passage of any signal generated at the same time, or a short time after, the sampling strobe. This embodiment further limits the ability of the kickout energy from effecting other portions of the test and measurement system.

Figure 7:
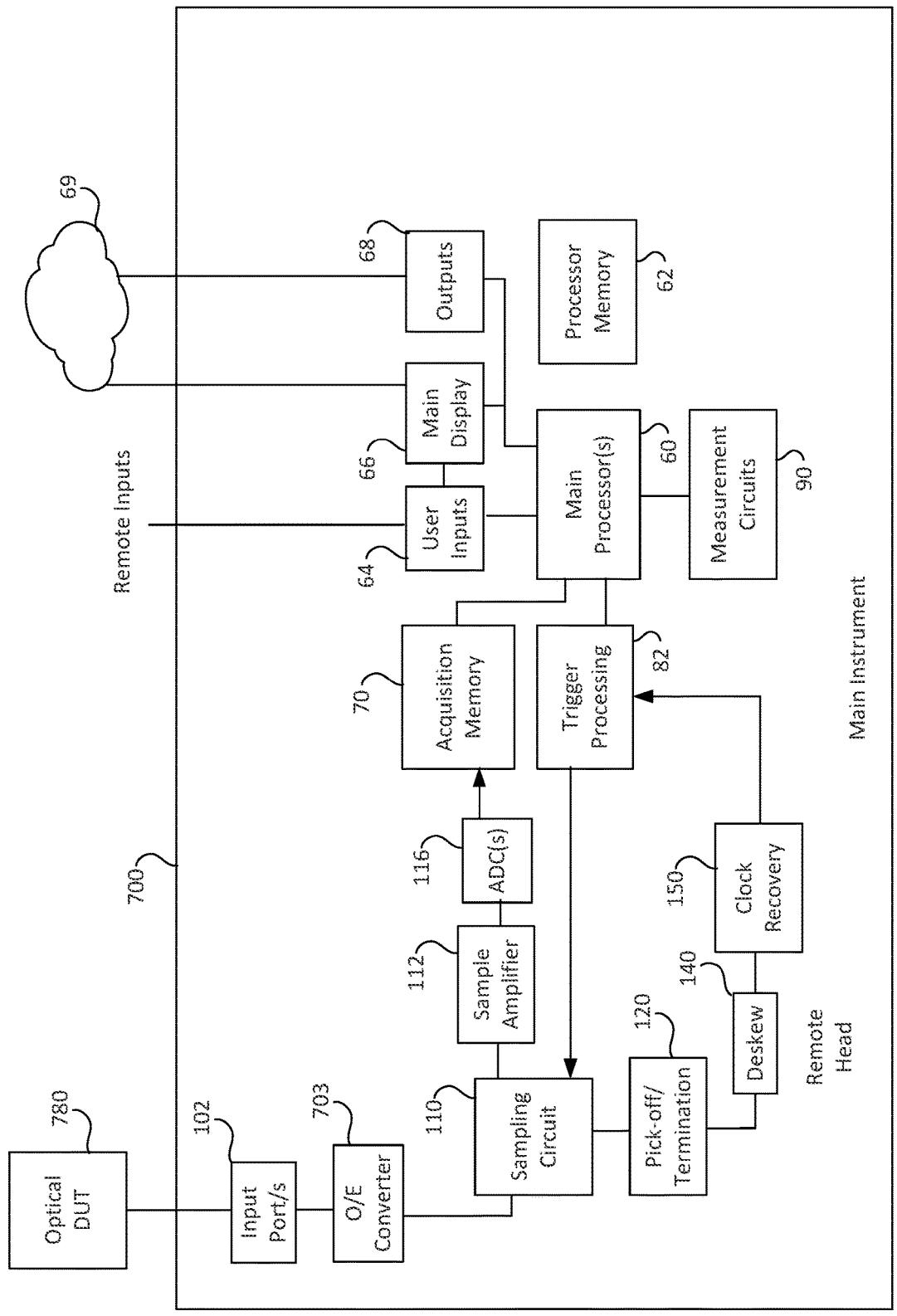
FIG. 7 is a block diagram of an integrated test and measurement system structured to receive an optical signal from a Device Under Test (DUT), according to disclosed embodiments.

While the implementation can be partially or fully inside of a remote head, as illustrated above in FIGS. 1A and 1B, some embodiments may use a monolithic (i.e., non-remote head) implementation. Specifically, FIG. 7 illustrates an instrument 700 that operates without use of a remote head. Instead, all of the main components described above are integrated into a single instrument 700. A difference between the above embodiments and the one illustrated in FIG. 7 is that a DUT 780 is an optical DUT, meaning that the signal for testing generated by the DUT 780 is an optical signal. Accordingly, the instrument 700 includes an optical-to-electrical converter 703 between the input ports 102 and the sampling circuit 110. In such a case, any kickout energy generated by sampling the input signal is blocked from being reflected back to the DUT 780 by the presence of the optical-to-electrical converter 703. Note, though, that the input signal from the DUT 780, in the same fashion as described above, is not split prior to being sampled by the sampling circuit 110. Instead, the input is sampled by the sampling circuit 110 prior to being provided to other components of the instrument 700. In other words, the instrument 700, like the systems described above, still includes a pick-off/termination circuit 120 that is located after the sampling circuit 110. And this embodiment described with reference to FIG. 7 may further include any or all of the kickout energy-dissipating strategies described above to prevent the kickout energy from the sampling circuit 110 being propagated through the rest of the instrument 700 and so disturbing the operation.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the technologies disclosed herein are provided below. A configuration of the technologies may include any one or more, and any combination of, the examples described below.

Example 1 is a test and measurement device including an input port to receive an input signal, a sampling circuit structured to generate a sample from the input signal, in which generating the sample from the input signal produces an amount of kickout energy, and an energy reducing circuit coupled between the sampling circuit and one or more other components of the test and measurement device, the energy reducing circuit structured to decrease the amount of kickout energy from the sampling circuit.

Example 2 is a test and measurement device according to Example 1, in which the energy reducing circuit comprises a resistor network.

Example 3 is a test and measurement device according to Example 2, in which the resistor network comprises one or more variable resistors.

Example 4 is a test and measurement device according to any of the preceding Examples, in which the energy reducing circuit includes a pickoff circuit, a physical interconnect between the pickoff circuit and the one or more other components of the test and measurement device, and an equalizer structured to minimize the effects of the physical interconnect.

Example 5 is a test and measurement device according to Example 4, in which the interconnect is a coaxial cable.

Example 6 is a test and measurement device according to any of the preceding Examples, in which the one or more other components of the test and measurement device comprises a clock recovery circuit.

Example 7 is a test and measurement device according to Example 6, in which the input port, sampling circuit, and energy reducing circuit are disposed in a remote head, and in which the clock recovery circuit is disposed in a main instrument connected to the remote head through an interconnect.

Example 8 is a test and measurement device according to any of the preceding Examples, in which the energy reducing circuit comprises an amplifier.

Example 9 is a test and measurement device according to any of the preceding Examples, in which the sampling circuit is driven by a component generating a strobe sampling signal, and in which the energy reducing circuit comprises a valve having the strobe sampling signal as an input, and structured to block passage of the kickout energy to the one or more other components of the test and measurement device when the strobe sampling signal is received by the valve.

Example 10 is a test and measurement device according to Example 9, in which valve is structured to block passage of the kickout energy to the one or more other components of the test and measurement device for a period following generation of the strobe sampling signal.

Example 11 is a test and measurement device according to any of the preceding Examples, in which no signal splitter is disposed between the input port and the sampling circuit.

Example 12 is a test and measurement device according to any of the preceding Examples, in which the input port is structured to receive an optical signal, and further comprising an optical-to-electrical converter disposed between the input port and the sampling circuit.

Example 13 is a method of operating a test and measurement device, including receiving an input signal at an input port, generating a sample from the input signal, in which generating the sample from the input signal produces an amount of kickout energy, reducing the amount of kickout energy in an energy reducing circuit, picking off a signal from the energy reducing circuit, and sending the picked-off signal to one or more other components of the test and measurement device.

Example 14 is a method according to Example 13, in which the energy reducing circuit comprises a resistor network.

Example 15 is a method according to any of the preceding Example methods, in which reducing the amount of kickout energy includes absorbing at least some of the amount of kickout energy through a physical interconnect between a remote head of the measurement device and a main measurement device.

Example 16 is a method according to Example 15, further comprising absorbing at least some of the amount of kickout energy through an equalizer having preset conditions based on physical properties of the physical interconnect.

Example 17 is a method according to any of the preceding Example methods, in which the energy reducing circuit comprises an amplifier.

Example 18 is a method according to any of the preceding Example methods, in which generating a sample from the input signal is initiated through a strobe sampling signal, and in which reducing the amount of kickout energy comprises operating a valve controlled by the strobe sampling signal.

Example 19 is a method according to Example 18, in which the valve blocks a passage of the kickout energy through the valve for a period following generation of the strobe sampling signal.

Example 20 is a method according to any of the preceding Example methods, further comprising not splitting the input signal prior to generating the sample from the input signal.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

The invention claimed is:

1. A test and measurement device, comprising:
    an input port to receive an input signal;
    a sampling circuit structured to generate a sample from the input signal, in which generating the sample from the input signal produces an amount of kickout energy;
    an energy reducing circuit coupled between the sampling circuit and one or more other components of the test and measurement device, the energy reducing circuit structured to decrease the amount of kickout energy from the sampling circuit and pass an energy-reduced input signal; and
    a clock recovery circuit configured to receive the energy-reduced input signal from the energy reducing circuit.

2. The test and measurement device according to claim 1, in which the energy reducing circuit comprises a resistor network.

3. The test and measurement device according to claim 2, in which the resistor network comprises one or more variable resistors.

4. The test and measurement device according to claim 1, in which the energy reducing circuit comprises:

a pickoff circuit;

a physical interconnect between the pickoff circuit and the one or more other components of the test and measurement device; and an equalizer structured to minimize the effects of the physical interconnect.

5. The test and measurement device according to claim 4, in which the interconnect is a coaxial cable.

6. The test and measurement device according to claim 1, in which the input port, sampling circuit, and energy reducing circuit are disposed in a remote head, and in which the clock recovery circuit is disposed in a main instrument connected to the remote head through an interconnect.

7. The test and measurement device according to claim 1, in which the energy reducing circuit comprises an amplifier.

8. The test and measurement device according to claim 1, in which the sampling circuit is driven by a component generating a strobe sampling signal, and in which the energy reducing circuit comprises a valve having the strobe sampling signal as an input, and structured to block passage of the kickout energy to the one or more other components of the test and measurement device when the strobe sampling signal is received by the valve.

9. The test and measurement device according to claim 8, in which the valve is structured to block passage of the kickout energy to the one or more other components of the test and measurement device for a period following generation of the strobe sampling signal.

10. The test and measurement device according to claim 1, in which no signal splitter is disposed between the input port and the sampling circuit.

11. The test and measurement device according to claim 1, in which the input port is structured to receive an optical signal, and further comprising an optical-to-electrical converter disposed between the input port and the sampling circuit.

12. A method of operating a test and measurement device, comprising:

receiving an input signal at an input port;

generating a sample from the input signal, in which generating the sample from the input signal produces an amount of kickout energy;

reducing the amount of kickout energy in an energy reducing circuit;

picking off a signal from the energy reducing circuit; and sending the picked-off signal to one or more other components of the test and measurement device, the one or more other components comprising a clock recovery circuit configured to receive the picked-off signal from the energy reducing circuit.

13. The method according to claim 12, in which the energy reducing circuit comprises a resistor network.

14. The method according to claim 12, in which reducing the amount of kickout energy comprises:

absorbing at least some of the amount of kickout energy through a physical interconnect between a remote head of the measurement device and a main measurement device.

15. The method according to claim 14, further comprising absorbing at least some of the amount of kickout energy through an equalizer having preset conditions based on physical properties of the physical interconnect.

16. The method according to claim 12, in which the energy reducing circuit comprises an amplifier.

17. The method according to claim 12, in which generating a sample from the input signal is initiated through a strobe sampling signal, and in which reducing the amount of kickout energy comprises operating a valve controlled by the strobe sampling signal.

18. The method according to claim 17, in which the valve blocks a passage of the kickout energy through the valve for a period following generation of the strobe sampling signal.

19. The method according to claim 12, further comprising not splitting the input signal prior to generating the sample from the input signal.

* * * * *